(12) United States Patent
Abe

(10) Patent No.: US 6,321,368 B1
(45) Date of Patent: Nov. 20, 2001

(54) LSI LAYOUT DESIGNING APPARATUS, COMPUTER-IMPLEMENTED METHOD OF DESIGNING LSI LAYOUT AND COMPUTER READABLE STORAGE MEDIUM

(75) Inventor: Koji Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/129,426

(22) Filed: Aug. 5, 1998

(30) Foreign Application Priority Data

Aug. 6, 1997 (JP) .................................................. 9-212268

(51) Int. Cl.$^7$ ...................................................... G06F 17/50
(52) U.S. Cl. ...................................................................... 716/9
(58) Field of Search ............................................ 716/9, 11

(56) References Cited

U.S. PATENT DOCUMENTS 5,654,898 * 8/1997 Roetcisoender ........................... 716/9
6,035,111 * 3/2000 Suzuki ..................................... 716/11

* cited by examiner

*Primary Examiner*—Matthew Smith
*Assistant Examiner*—Thuan Do
(74) *Attorney, Agent, or Firm*—Arent Fox Kintner Plotkin & Kahn.

(57) ABSTRACT

A LSI layout designing apparatus which is implemented by a computer and designs a layout of a LSI on a display screen includes a timing adjusting unit for carrying out a timing adjustment process with respect to logic circuit data of the LSI already subjected to a layout process, and a layout restoration unit for restoring an original layout of the LSI prior to the timing adjustment process and reflecting a change of cells caused by the timing adjustment process on the original layout which is displayed on the display screen.

15 Claims, 14 Drawing Sheets

END OF LSI LAYOUT
DESIGN PROCESS

OVERLAP CAUSED BY
ARRANGEMENT PRIOR TO
RESTORATION

WIRING NOT REACHING CELL

HIGHLIGHTED DISPLAY AT PART
WHERE ADDED CELL IS ARRANGED
IN OVERLAPPING MANNER

HIGHLIGHTED DISPLAY OF
OVERLAPPING PART

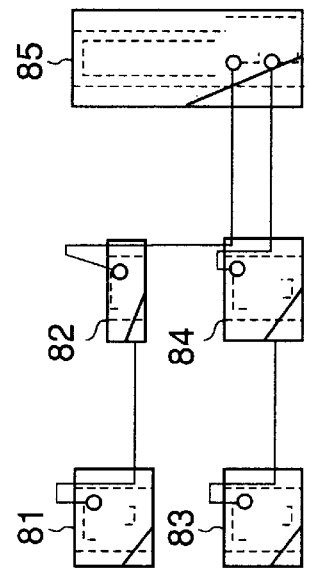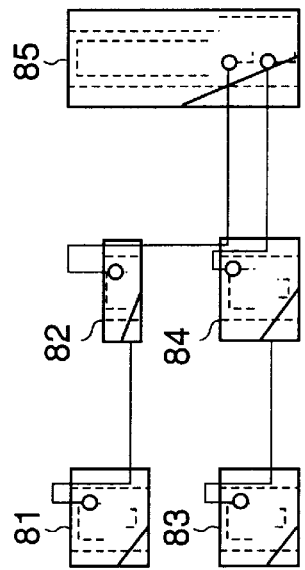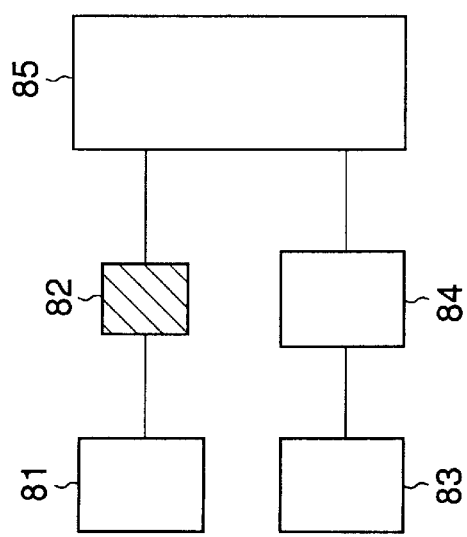

LSI LAYOUT DESIGNING APPARATUS, COMPUTER-IMPLEMENTED METHOD OF DESIGNING LSI LAYOUT AND COMPUTER READABLE STORAGE MEDIUM

BACKGROUND OF THE INVENTION

The present invention generally relates to large scale integrated circuit (LSI) layout designing apparatuses, computer-implemented methods of designing LSI layout and computer readable storage mediums, and more particularly to a LSI layout designing apparatus and a computer-implemented method of designing LSI layout by computer aided design (CAD), and to a computer readable storage medium which stores a program for making a computer carry out a LSI layout design by such a LSI layout design method.

Recently, the number of elements in the LSIs has increased considerably, and the trend is for the functions of the LSIs to become more and more complex. In order to cope with the increasing elements and complexity of the LSIs, an electronic design automation (EDA) tool is essential when designing the LSIs.

Conventionally, the design process of the EDA is generally divided into a logic design process and a physical design process. A layout design process which designs the layout of the LSI is included in the physical design process.

A boundary between the logic design process and the physical design process originally is natural, and it is essentially unnecessary to integrate or feedback data between the logic design process and the physical design process, because the performance of the circuit is directly dependent upon a gate delay time. This gate delay time is the time required for a signal to propagate from an input terminal of the logic gate to an output terminal of the logic gate. In other words, the circuit performance is conventionally unaffected by a delay time generated in a wire which connects two logic gates.

For this reason, the person who designs the LSI designs the LSI using timing parameters which are based on characteristics of each of macro cells of the LSI. That is, the delay times of the connecting wires which are determined after determining the layout of the macro cells of the LSI have virtually no effect on the performance of the LSI. Accordingly, after making the logic design independently, the person who designs the LSI simply inputs the result of the logic design to an automatic LSI layout designing apparatus. The result of the logic design is often called a net list or logic circuit data.

However, the semiconductor production technology has developed considerably in recent years. As a result, the size of various elements have become extremely small, transistors having extremely high-speed switching capability have been developed, and the gate delay time has become extremely short. Consequently, the gate delay time is no longer the primary factor which determines the performance of the LSI, and instead, the delay times of the connecting wires have become dominant among the signal delay times. Hence, it is becoming more and more difficult to satisfy the timing specifications of the LSI when designing the LSI.

SUMMARY OF THE INVENTION

Accordingly, it is a general object of the present invention to provide a novel and useful LSI layout designing apparatus, computer-implemented method of designing LSI layout and computer readable storage medium, in which the problems described above are eliminated.

Another and more specific object of the present invention is to provide a LSI layout designing apparatus, computer-implemented method of designing LSI layout and computer readable storage medium which are capable of quickly developing the LSI by taking into consideration elements of the logic design process in the layout design process which is included in the physical design process. According to the LSI layout designing apparatus, computer-implemented method of designing LSI layout and computer readable storage medium of the present invention, it is possible to eliminate the problems associated with the conventional layout design process which was unrelated to the logic design process. In other words, the present invention can quickly develop the LSI by reducing iterations between the logic design process and the layout design process, and by reducing the load of the layout design process itself.

Still another object of the present invention is to provide a LSI layout designing apparatus implemented by a computer and designing a layout of a LSI on a display screen, comprising timing adjusting means for carrying out a timing adjustment process with respect to logic circuit data of the LSI already subjected to a layout process, and layout restoration means for restoring an original layout of the LSI prior to the timing adjustment process and reflecting a change of cells caused by the timing adjustment process on the original layout which is displayed on the display screen. According to the LSI layout designing apparatus of the present invention, it is possible to prevent a timing error from being newly generated by the timing adjustment process, and to reduce the iterations between the logic design and the layout design (physical design), so as to enable quick developing of the LSI. Further, by re-using the original wirings to the extent possible, it is possible to eliminate the need to newly form all wirings to suit the layout which is modified according to the timing adjustment process. As a result, it is possible to prevent a new timing error from being generated by the wirings which are all newly formed, thereby enabling the layout design to be completed within a short time and realizing quick development of the LSI.

A further object of the present invention is to provide a computer-implemented method of designing a LSI layout on a display screen, comprising the steps of (a) carrying out a timing adjustment process with respect to logic circuit data of the LSI already subjected to a layout process, and (b) restoring an original layout of the LSI prior to the timing adjustment process and reflecting a change of cells caused by the timing adjustment process on the original layout which is displayed on the display screen. According to the computer-implemented method of the present invention, it is possible to prevent a timing error from being newly generated by the timing adjustment process, and to reduce the iterations between the logic design and the layout design (physical design), so as to enable quick developing of the LSI. Further, by re-using the original wirings to the extent possible, it is possible to eliminate the need to newly form all wirings to suit the layout which is modified according to the timing adjustment process. As a result, it is possible to prevent a new timing error from being generated by the wirings which are all newly formed, thereby enabling the layout design to be completed within a short time and realizing quick development of the LSI.

Another object of the present invention is to provide a computer readable storage medium which stores a program for causing a computer to design a LSI layout on a display screen, comprising timing adjusting means for causing the computer to carry out a timing adjustment process with respect to logic circuit data of the LSI already subjected to a layout process, and layout restoration means for causing the computer to restore an original layout of the LSI prior to the timing adjustment process and reflect a change of cells caused by the timing adjustment process on the original layout which is displayed on the display screen. According to the computer readable storage medium of the present invention, it is possible to prevent a timing error from being newly generated by the timing adjustment process, and to reduce the iterations between the logic design and the layout design (physical design), so as to enable quick developing of the LSI. Further, by re-using the original wirings to the extent possible, it is possible to eliminate the need to newly form all wirings to suit the layout which is modified according to the timing adjustment process. As a result, it is possible to prevent a new timing error from being generated by the wirings which are all newly formed, thereby enabling the layout design to be completed within a short time and realizing quick development of the LSI.

Other objects and further features of the present invention will be apparent from the following detailed description when read in conjunction with the accompanying drawings.

BRIEF DESCRIPTION OF THE DRAWINGS

FIGS. 18A, 18B and 18C are diagrams for explaining the replacement of the cell by the cell having the small driving capacity in an actual layout.

DESCRIPTION OF THE PREFERRED EMBODIMENTS

Figure 1:
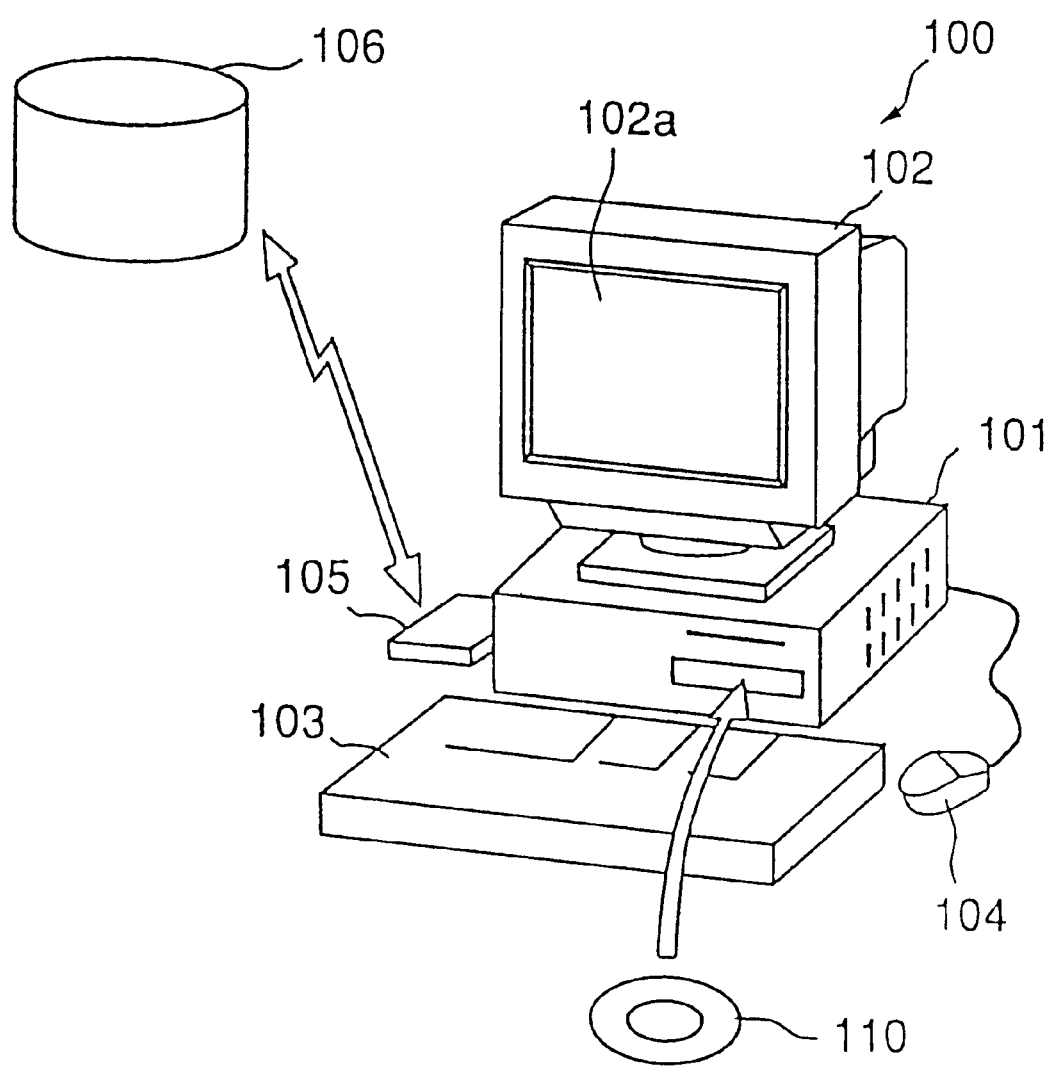
FIG. 1 is a perspective view showing an embodiment of a LSI layout designing apparatus according to the present invention.

FIG. 1 shows an embodiment of a LSI layout designing apparatus according to the present invention. In this embodiment of the LSI layout designing apparatus, the present invention is applied to a computer system. This embodiment of the LSI layout designing apparatus employs an embodiment of a computer-implemented method of designing LSI layout according to the present invention, and an embodiment of a computer readable storage medium according to the present invention.

A computer system 100 shown in FIG. 1 is provided with a main body 101 which includes a CPU, a disk drive and the like, a display unit 102 which displays an image on a display screen 102a in response to an instruction from the main body 101, a keyboard 103 for inputting various information to the computer system 100, a mouse 104 for specifying an arbitrary position on the display screen 102a of the display unit 102, and a modem 105 for making an access to an external database or the like and for downloading programs or the like stored in another computer system. The programs stored in a portable storage medium such as a disk 110 or, downloaded from a storage medium 106 of another computer system using a communication unit such as the modem 105, are input and compiled in the computer system 100. The programs include a program for making the CPU of the computer system 101 carry out a LSI layout designing process.

Figure 2:
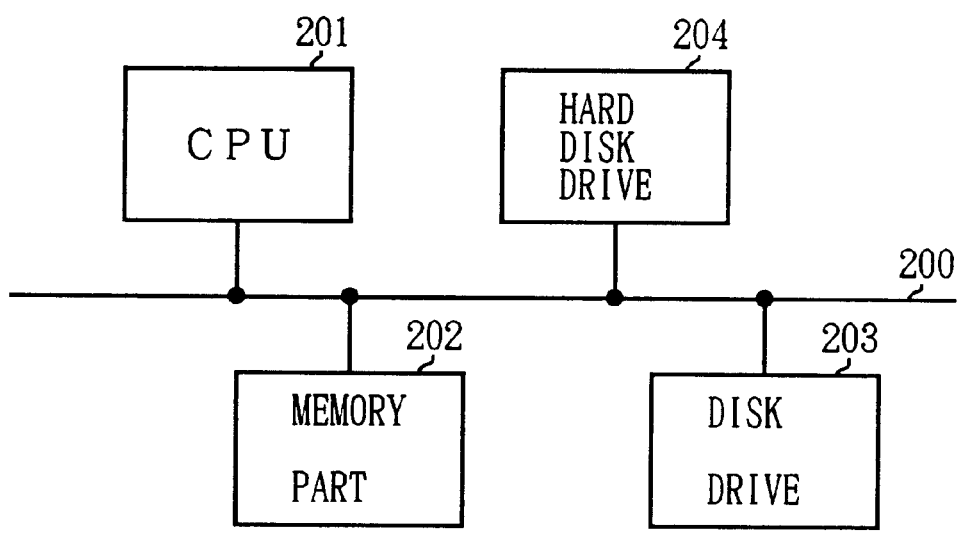
FIG. 2 is a system block diagram showing an important part of the LSI layout designing apparatus shown in FIG. 1.

FIG. 2 shows the construction of the main body 101. The main body 101 generally includes a CPU 201, a memory part 202, a disk drive 203 and a hard disk drive 204 which are coupled via a bus 200. The CPU 201 controls the general operation of the computer system 100. The memory part 202 stores data and programs to be executed by the CPU 201. The disk drive 203 reads data from and writes data to the disk 110 which is loaded into the disk drive 203. The hard disk drive 204 includes at least a hard disk, and data is read from and written to the hard disk by the hard disk drive 204. For example, the programs may be stored in the disk 110, and in such a case, the programs read from the disk 110 may be copied to the memory part 202. Similarly, the programs may be stored in the hard disk, and the programs read from the hard disk may be copied to the memory part 202.

For example, the disk 110 which stores the program for making the CPU 201 carry out the LSI layout design process forms the embodiment of the computer readable storage medium according to the present invention. However, the computer readable storage medium is not limited to the disk 110, and may be selected from any type of medium suited for storing the program. The computer readable storage medium may be selected from various kinds of semiconductor memory devices, various kinds of disks such as floppy disks, magneto-optic disks and CD-ROMs, portable mediums such as IC card memories, and mediums accessible by a computer system which may be coupled to the computer system 100 via a communication unit or a communication means such as a modem and a LAN.

Figure 3:
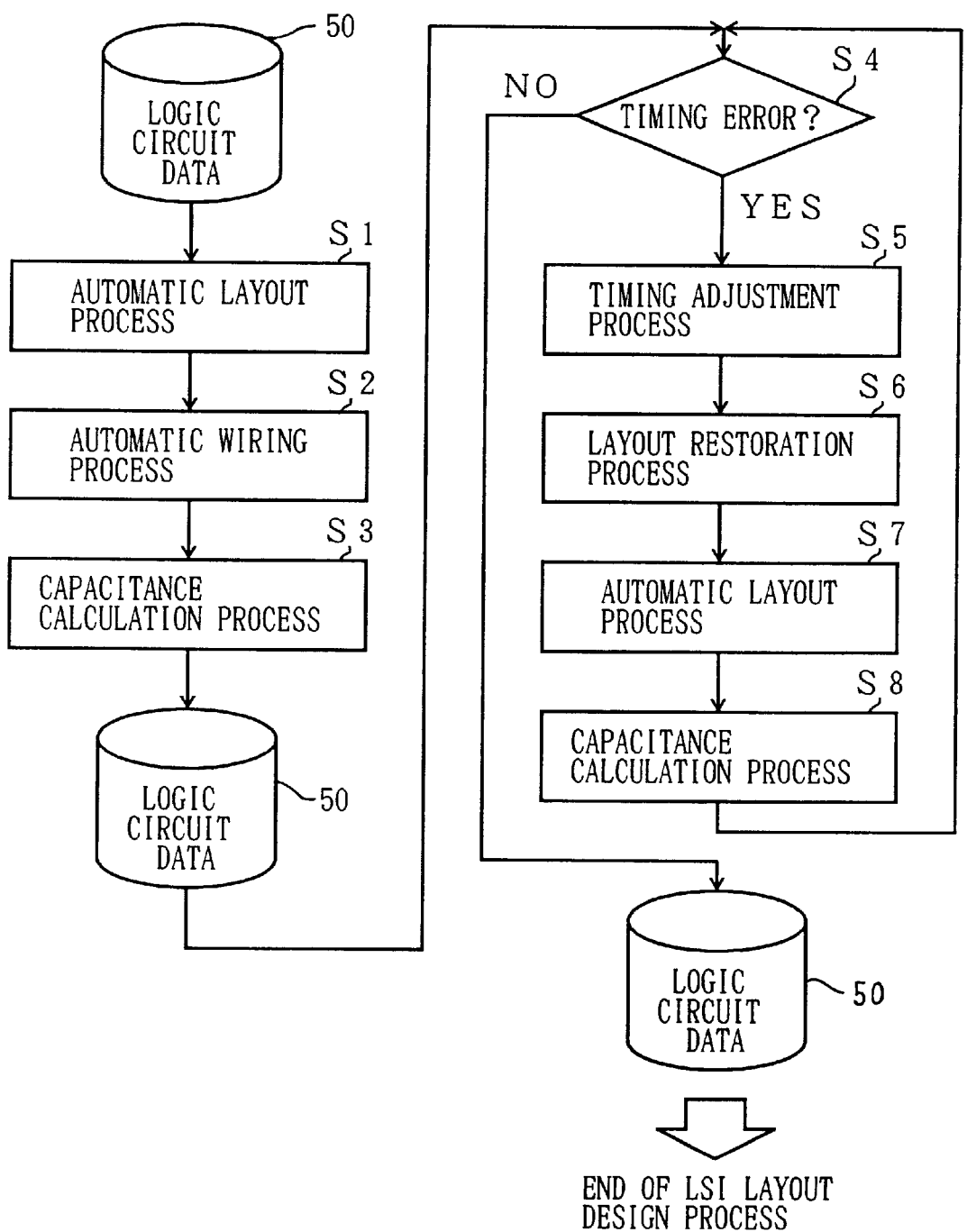
FIG. 3 is a flow chart generally showing a LSI layout design process.

FIG. 3 shows a flow chart which generally shows a LSI layout design process. This LSI layout design process is carried out by the CPU 201 based on the program read from the disk 110, for example. In FIG. 3, logic circuit data which have been checked of timing conditions by a newly designed simulation or the like are read from a storage unit 50. For example, this storage unit 50 may be formed by the hard disk of the hard disk drive 204, the memory part 202 or, may be provided externally to the computer system 100 but accessible by the computer system 100.

A step SI carries out an automatic layout process with respect to the logic circuit data read from the storage unit 50. A step S2 carries out an automatic wiring process with respect to the logic circuit data read from the storage unit 50. In addition, a step S3 carries out a capacitance calculation process with respect to the logic circuit data read from the storage unit 50. The logic circuit data obtained as a result of the steps S1 through S3 include actual delays and actual wiring capacitances, and it is thus necessary to recheck the timing conditions. Hence, a step S4 decides whether a timing error is, generated in the logic circuit-data obtained due to the actual delays and actual wiring capacitances. If the decision result in the step S4 is NO, the obtained logic circuit data are stored in the storage unit 50, and the LSI layout design process ends.

On the other hand, if the decision result in the step S4 is YES, a step S5 carries out a timing adjustment process with respect to the obtained logic circuit data, so as to adjust the timings to satisfy the required timing conditions. Because the delay times caused by the wiring greatly affect the performance of the recent LSI, the probability that the timing error is generated in the obtained logic circuit data is extremely high.

With respect to the logic circuit data which are adjusted of the timings in the step S5, a step S5 carries out a layout restoration process, a step S7 carries out an automatic wiring process, and a step S8 carries out a capacitance calculation process. The layout restoration process of the step S6 forms an important part of this embodiment. After the step S8 the process returns to the step S4 which again decides whether or not a timing error is generated in the logic circuit data which are adjusted of the timings. If the decision result in the step S4 is YES again, the steps S5 through S8 are repeated, so as to repeat the layout design process similar to that described above which includes the layout restoration process, the automatic wiring process and the capacitance calculation process. On the other hand, if the decision result in the step S4 is NO, the logic circuit data adjusted of the timings are stored in the storage unit 50, and the LSI layout design process ends.

In this embodiment, the layout restoration process effectively utilizes the existing layout, so as to prevent the generation of new timing errors caused by the timing adjustment process. As a result, the number of times the above described layout design process is repeated is effectively reduced, and the iteration process does not require an extremely long time to carry out.

Figure 4:
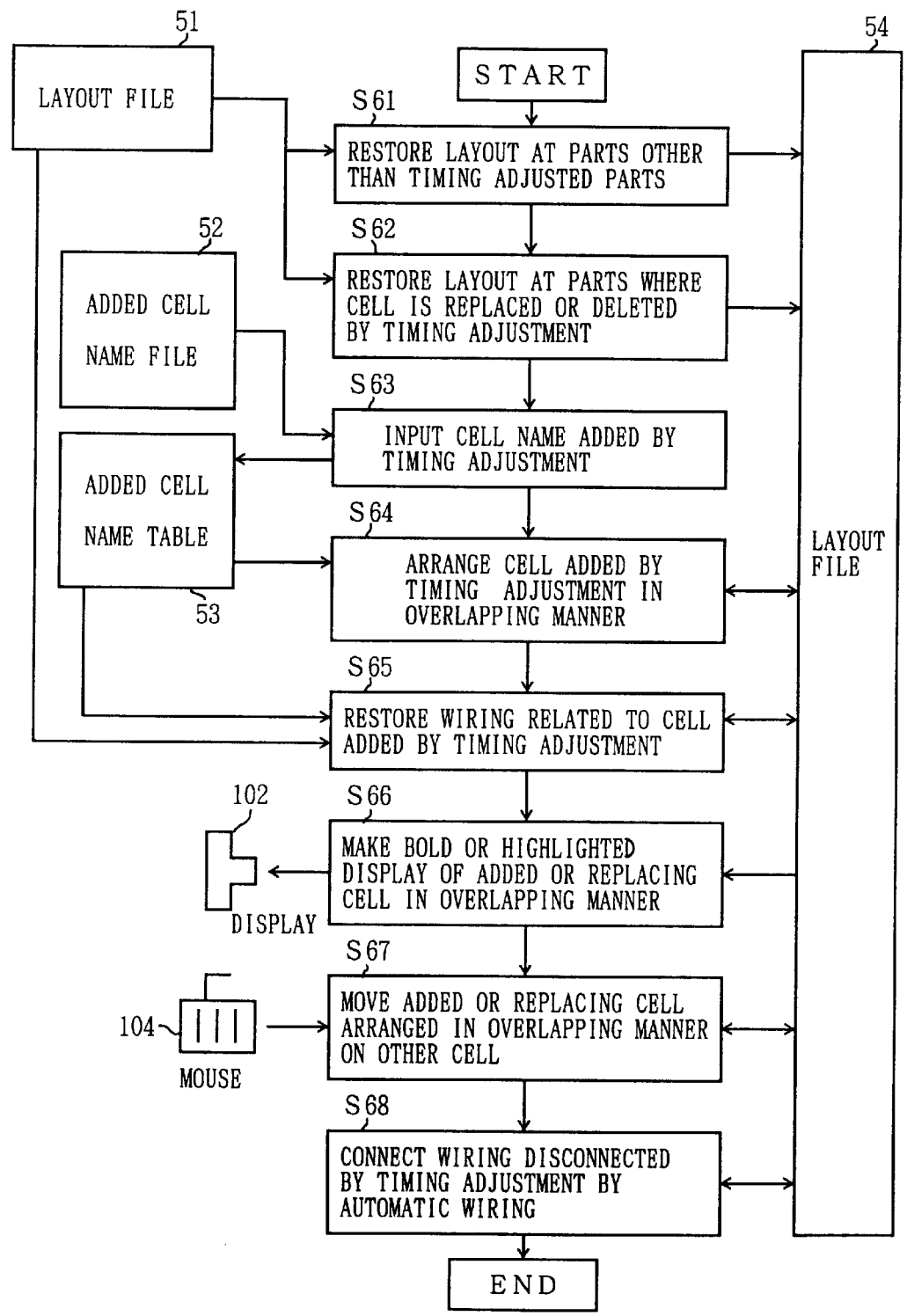
FIG. 4 is a flow chart for explaining an important part of the LSI layout design process shown in FIG. 3.

FIG. 4 shows a flow chart for explaining an important part of the LSI layout design process shown in FIG. 3, more particularly, the layout restoration process of the step S6.

In FIG. 4, a step S61 restores the layout before the timing adjustment process, as it is, based on a layout file 51 prior to the timing adjustment, and inputs the layout information in a layout file 54 after the timing adjustment. The layout files 51 and 54 may be stored in the storage unit 50, for example. A step S62 replaces a cell which is replaced by the timing adjustment process in the layout file 54 after the timing adjustment, based on the logic circuit data which is adjusted of the timings. In addition, the step S62 deletes a cell which is deleted by the timing adjustment process in the layout file 54 after the timing adjustment.

A step S63 obtains information related to a cell which is added by the timing adjustment from an added cell name file 52 which stores the cell names of the cells added by the timing adjustment process in combination with the cell names of the existing cells which generated the timing error.

Hence, it is possible to know from the information stored in the added cell name file 52 the location where the added cell should be arranged in the layout. The step S63 also stores the added cell name information in an added cell name table 53. The added cell name file 52 and the added cell name table 53 may be stored in the storage unit 50, for example.

A step S64 arranges the cell which is added by the timing adjustment process in an overlapping manner on the cell which generated the timing error, based on the layout information read from the layout file 54, and stores the layout information after the overlap in the layout file 54. The cell which generated the timing error is read from the added cell name table 53.

A step S65 restores the wiring in a vicinity of the cell which is added by the timing adjustment process, based on the information read from the layout files 51 and 54.and the added cell name table 53, and stores the layout information after the wiring restoration in the layout file 54. In other words, the wiring before the cell is added is restored as it is.

A step S66 displays on the display screen 102a of the display unit 102 in a bold or highlighted display the added cell and the replacing cell, based on the information read from the layout file 54. The added cell is added by the timing adjustment process and is arranged in the overlapping manner on another cell which generated the timing error. On the other hand, the replacing cell which replaced a cell has a large driving capacity and is arranged in an overlapping manner on another existing cell. In addition, the step S66 stores the information related to the bold or highlighted display in the layout file 54. Accordingly, the operator, that is, the person who designs the LSI layout, can easily and quickly recognize the added cell and the replaced cell from the bold or highlighted display.

A step S67 carries out an operation of moving the added cell or the replacing cell which is arranged in the overlapping manner on the other cell, based on the information read from the layout file 54, and in response to the operation made by the operator by use of the mouse 104. In addition, the step S67 stores the information related to the added cell or the replacing cell which is moved, in the layout file 54. This operation of moving the added cell or the replacing cell can be made in an interactive manner on the display screen 102a by use of the mouse 104. Furthermore, since it is unnecessary to input a new cell in the layout and it is sufficient to simply carry out the operation of moving the cell which is arranged in the overlapping manner on the other cell, it is possible to considerably reduce the load on the operator.

Then, a step S68 connects the wires which become disconnected by the addition, deletion or replacement of the cell using an automatic wiring function, based on the information read from the layout file 54, and the layout restoration process ends after storing the final layout information in the layout file 54. The automatic wiring process of this step S68 is carried out by re-using the wiring of the layout before the timing adjustment process, and thus, it is possible to reduce the processing time of the automatic wiring process.

Figure 5A:
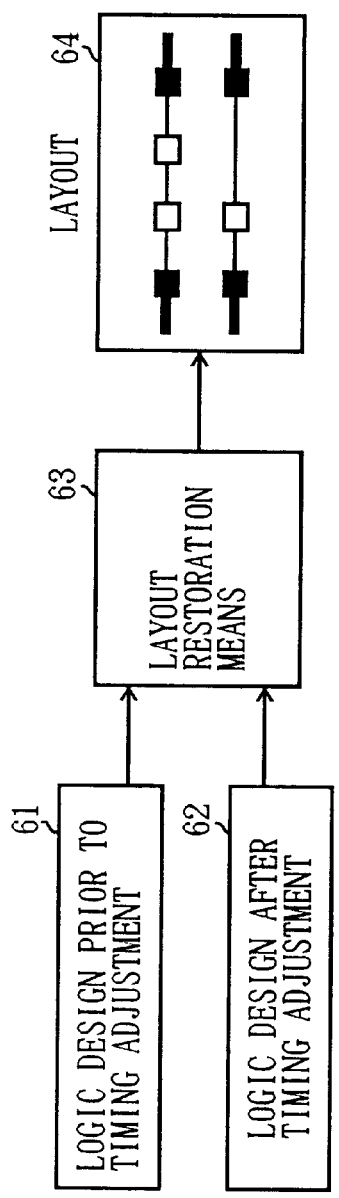
FIGS. 5A and 5B are diagrams for explaining the layout restoration process of the step S6 shown in FIG. 3 and shown in FIG. 4.
Figure 5B:
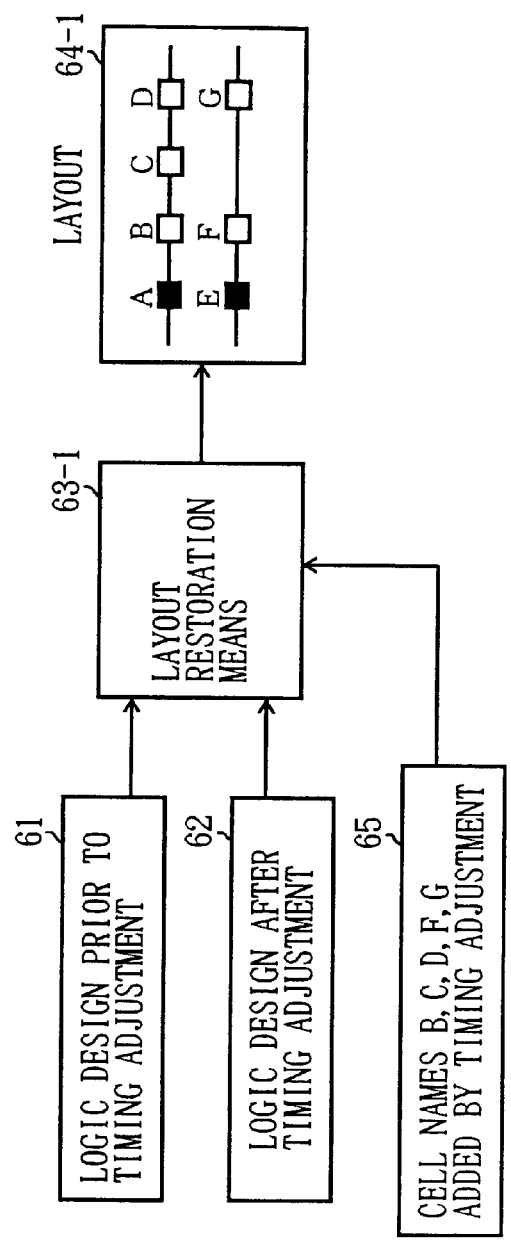

FIGS. 5A and 5B are diagrams for explaining the layout restoration process of the step S6 shown in FIG. 3 and shown in FIG. 4.

FIG. 5A is a diagram for explaining a general layout restoration process. In FIG. 5A, a black rectangular mark indicates a cell which exists prior to the timing adjustment process, a bold solid line indicates a wiring which exists prior to the timing adjustment process, a white rectangular mark indicates a cell which is newly added by the timing adjustment process, and a thin solid line indicates a wiring which is newly formed by the timing adjustment process. A layout restoration means 63 formed by a CPU carries out the layout restoration process based on a logic design 61 prior to the timing adjustment process and a logic design 62 after the timing adjustment process, and restores a layout 64. Although FIG. 5A shows the white rectangular marks and the thin solid lines, the newly added cells and the newly formed wirings are not visible on the actual display screen, that is, are not restored according to the general layout restoration process.

FIG. 5B is a diagram for explaining the layout restoration process of this embodiment. In FIG. 5B, a black rectangular mark indicates a cell which exists prior to the timing adjustment process, and a white rectangular mark indicates a cell which is newly added by the timing adjustment process. According to this embodiment, a layout restoration means 63-1 formed by the CPU 201 carries out the layout restoration process based on a logic design 61 prior to the timing adjustment process, a logic design 62 after the timing adjustment process and information 65 related to cells B, C, D, F and G which are newly added by the timing adjustment process, and restores a layout 64-1. The information 65 is obtained from the added cell name file 52 shown in FIG. 4. Hence, the layout restoration means 63-1 can recognizes from the information 65 that the cells B, C, D, F and G are the newly added cells, as well as the locations where these newly added cells B, C, D, F and G are to be arranged. Therefore, the layout 64-1 which is displayed on the display screen 102a includes cells A and B which exist prior to the timing adjustment process, the wirings which exist prior to the timing adjustment process, the newly added cells B, C, D, F and G which are added by the timing adjustment process, and the newly formed wirings which are newly formed by the timing adjustment process depending on the newly added cells B. C, D, F and G. As shown in FIG. 5B, the newly added cells B, C, D, F and G and the newly formed wirings are visible on the actual display screen 102a, that is, are restored according to the layout restoration process of this embodiment.

FIGS. 6A, 6B, 7A and 7B are diagrams for explaining the layout restoration process of the step S6 shown in FIG. 3, that is, the overlapping arrangement of the newly added cells which are added by the timing adjustment process over the existing cells.

Figure 6A:
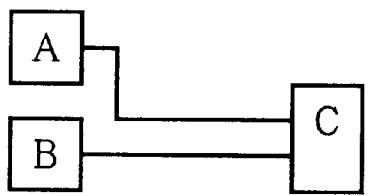
FIGS. 6A, 6B, 7A and 7B are diagrams for explaining the layout restoration process of the step S6 shown in FIG. 3, that is, the overlapping arrangement of the newly added cells which are added by the timing adjustment process over the existing cells.
Figure 6B:
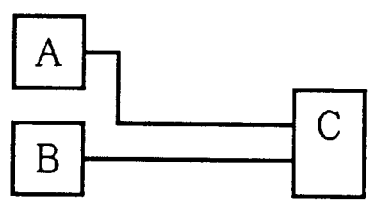

FIG. 6A shows the logic design prior to the timing adjustment process, including cells A, B and C and the connecting wirings. FIG. 6B shows a layout displayed on the display screen 102a prior to the timing adjustment process, including the cells A, B and C and the connecting wirings.

Figure 7A:
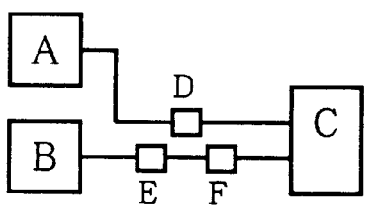
Figure 7B:
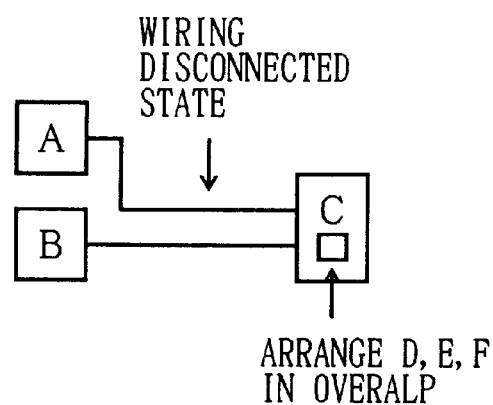

On the other hand, FIG. 7A shows the newly added cells D, E and F which are inserted in the logic design by the timing adjustment process. FIG. 7B shows a layout displayed on the display screen 102a after the timing adjustment process, including the newly added cells D, E and F which are arranged in the overlapping manner on the cell C which generated the timing error.

In FIG. 7B, the wiring between the cells A and C is connected to the cell A but is not connected to the cell C, and the wiring between the cells A and C is thus in a disconnected state. In addition, the wiring between the cells B and C is connected to the cell B but is not connected to the cell C, and the wiring between the cells B and C is in a disconnected state. It is possible to freely specify from outside, that is, by operating the keyboard 103 and/or the mouse 104 whether the wiring which becomes disconnected by the addition of the cell is to be included in the cell C which generated the timing error or, to be included in the cell A or B provided in a stage preceding the cell C. The conventional wiring which becomes disconnected by being connected to the cell C which generated the timing error or by being connected to the cell A or B provided in the stage preceding the cell C, can be restored by the process carried out by the step S65 shown in FIG. 4. In the particular case shown in FIG. 7B, the wiring which becomes disconnected by being connected to the cell C which generated the timing error is included in the cell A or B which precedes the cell C.

The conventional wiring which becomes disconnected by being connected to the cell C which generated the timing error or by being connected to the cell A or B provided in the stage preceding the cell C in FIG. 7B are re-used as it is. More particularly, in the case shown in FIG. 7B, the conventional wiring which becomes disconnected is re-used as the wiring between the cells A and D and the wiring between the cells B and E. By utilizing the conventional wiring which becomes disconnected, it is possible to prevent a new timing error which would be generated if the wiring between the cells A and D and the wiring between the cells B and E were newly formed. The wiring between the cells D and C, the wiring between the cells E and F, and the wiring between the cells F and C are newly formed by the automatic wiring function.

FIGS. 8A, 8B, 9A and 9B are diagrams for explaining the layout restoration process of the step S6 shown in FIG. 3, that is, the deletion of the cells which are deleted by the timing adjustment process.

Figure 8A:
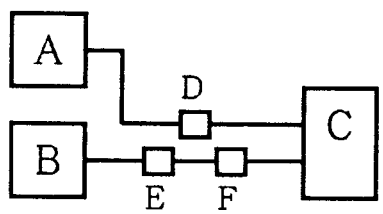
FIGS. 8A, 8B, 9A and 9B are diagrams for explaining the layout restoration process of the step S6 shown in FIG. 3, that is, the deletion of the cells which are deleted by the timing adjustment process.
Figure 8B:
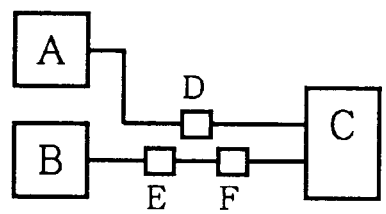

FIG. 8A shows the logic design prior to the timing adjustment process, including cells A, B, C, D, E and F and the connecting wirings. FIG. BB shows a layout displayed on the display screen 102a prior to the timing adjustment process, including the cells A, B, C, D, E and F and the connecting wirings.

Figure 9A:
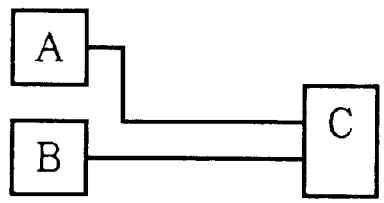
Figure 9B:
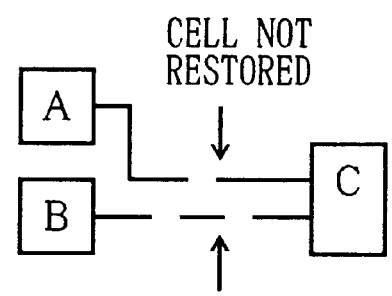

On the other hand, FIG. 9A shows the cells A, B and C and the connecting wirings which remain when the cells D, E and F are deleted in the logic design by the timing adjustment process. FIG. 9B shows a layout displayed on the display screen 102a after the timing adjustment process, including the cells A, B and C and the wirings but not including the cells D, E and F which are deleted.

In FIG. 9B, all of the wirings which are connected to the deleted cells D, E and F become disconnected. In addition, the wirings which become disconnected are re-used as they are, similarly to the case described above where the cells are newly added by the timing adjustment process. More particularly, in the case shown in FIG. 9B, the wirings which become disconnected are re-used as parts of the wiring between the cells A and C and the wiring between the cells B and C. The wirings at parts where the wirings become disconnected by the deletion of the cells D, E and F are newly formed by the automatic wiring function.

FIGS. 10A, 10B, 11A and 11B are diagrams for explaining the layout restoration process of the step S6 shown in FIG. 3, that is, the replacement of the cells by cells having a large driving capacity by the timing adjustment process.

Figure 10A:
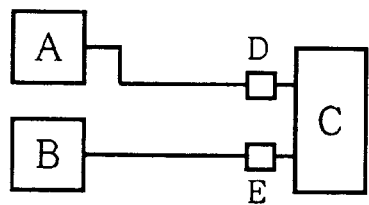
FIGS. 10A, 10B, 11A and 11B are diagrams for explaining the layout restoration process of the step S6 shown in FIG. 3, that is, the replacement of the cells by cells having a large driving capacity by the timing adjustment process.
Figure 10B:
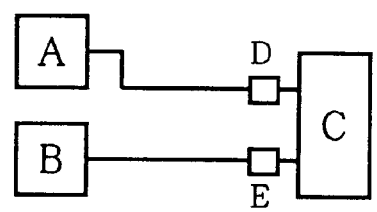

FIG. 10A shows the logic design prior to the timing adjustment process, including cells A, B, C, D and E and the connecting wirings. FIG. 10B shows a layout displayed on the display screen 102a prior to the timing adjustment process, including the cells A, B, C, D and E and the connecting wirings.

Figure 11A:
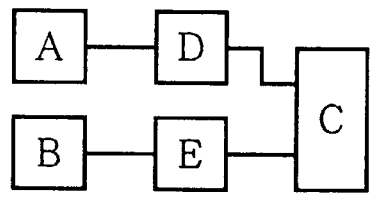
Figure 11B:
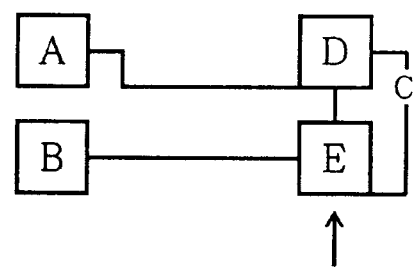

On the other hand, FIG. 11A shows the cells A, B, and C and the cells D and E which are replaced by the cells having the large driving capacity in the logic design by the timing adjustment process. FIG. 11B shows a layout displayed on the display screen 102a after the timing adjustment process, including the cells A, B and C, the cells D and E having the large driving capacity, and the wirings.

In FIG. 11B, since the cells D and E having the driving capacity larger than that of the original cells D and E are larger in size than the original cells D and E, the cells D and E having the large driving capacity are displayed in the overlapping manner on the existing cell C. Because the cells D and E having the large driving capacity are enlarged in size compared to the original cells D and E, the cell pattern is changed and the conventional wiring cannot be used as it is. For example, if the conventional wiring is connected to a first terminal of the cell before the replacement, there is a case where the conventional wiring becomes connected to a second terminal of the cell having the large driving capacity when the cell is replaced by the cell having the large driving capacity. In such a case, the conventional wiring cannot be used as it is. Accordingly, the wiring in a periphery of the cell having the large driving capacity and replacing the original cell is disconnected. But since the wiring in the periphery of the cell having the large driving capacity is disconnected, the conventional wiring reaching the periphery of the cell having the large driving capacity can be re-used as it is. The wiring between the cell having the large driving capacity and the conventional wiring reaching the periphery of the cell having the large driving capacity is newly formed by the automatic wiring function.

FIGS. 12A, 12B, 13A and 13B are diagrams for explaining the layout restoration process of the step S6 shown in FIG. 3, that is, the replacement of the cells by cells having a small driving capacity by the timing adjustment process.

Figure 12A:
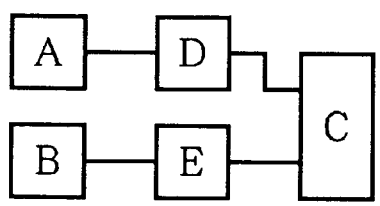
FIGS. 12A, 12B, 13A and 13B are diagrams for explaining the layout restoration process of the step S6 shown in FIG. 3, that is, the replacement of the cells by cells having a small driving capacity by the timing adjustment process.
Figure 12B:
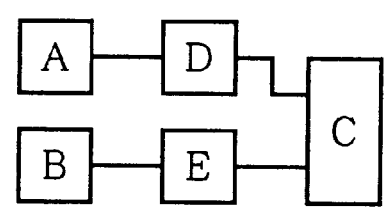

FIG. 12A shows the logic design prior to the timing adjustment process, including cells A, B, C, D and E and the connecting wirings. FIG. 12B shows a layout displayed on the display screen 102a prior to the timing adjustment process, including the cells A, B, C, D and E and the connecting wirings.

Figure 13A:
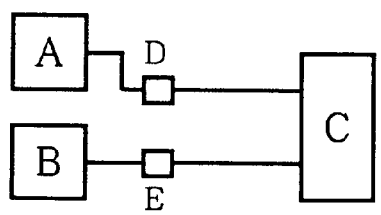
Figure 13B:
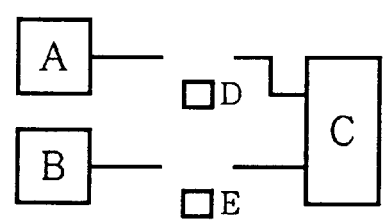

On the other hand, FIG. 13A shows the cells A, B and C and the cells D and E which are replaced by the cells having the small driving capacity in the logic design by the timing adjustment process. FIG. 13B shows a layout displayed on the display screen 102a after the timing adjustment process, including the cells A, B and C, the cells D and E having the small driving capacity, and the wirings.

In FIG. 13B, since the cells D and E having the driving capacity smaller than that of the original cells D and E are smaller in size than the original cells D and E, the conventional wirings connected to the original cells D and E do not reach the cells D and E having the small driving capacity. Hence, the conventional wirings are disconnected from the cells D and E having the small driving capacity. The space which becomes free by the reduced size of the cells D and E compared to the original cells D and E, may be effectively utilized by arranging other cells or other wirings therein. The conventional wiring can be re-used as it is, and the wiring between the cell having the small driving capacity and the conventional wiring is newly formed by the automatic wiring function.

Figure 14A:
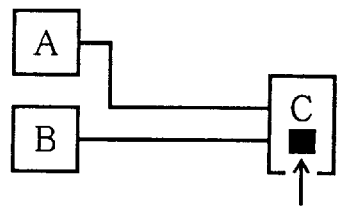
FIGS. 14A and 14B are diagrams for explaining the bold or highlighted display of the added cell and the replacing cell on the display screen.
Figure 14B:
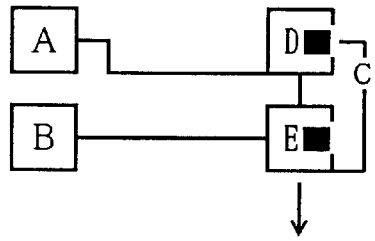

FIGS. 14A and 14B are diagrams for explaining the bold or highlighted display of the added cell and the replacing cell on the display screen 102a.

FIG. 14A shows the bold or highlighted display of the cells D, E and F in the overlapping manner on the existing cell C for the case shown in FIG. 7B described above. In FIG. 14A, the bold or highlighted display is indicated by a black rectangular mark.

FIG. 14B shows the bold or highlighted display of the cells D and E which have the large driving capacity than that of the original cells D and E which are replaced, in the overlapping manner on the existing cell C for the case shown in FIG. 11B described above. In FIG. 14B, the bold or highlighted display is indicated by a black rectangular mark.

According to the bold or highlighted display shown in FIGS. 14A and 14B, the operator can easily recognize the cell which has been added or replaced, and therefore easily recognize the cell to be moved. In addition, since the operator simply needs to recognize the bold or highlighted display of the cell and move the cell which is already displayed in the layout, the operator can quickly perform the cell moving operation and the load on the operator is considerably reduced.

Figure 15B:
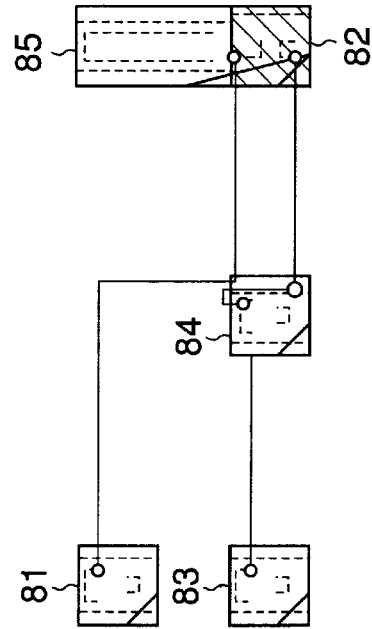
FIGS. 15A, 15B and 15C are diagrams for explaining the addition of the cell in an actual layout.
Figure 15C:
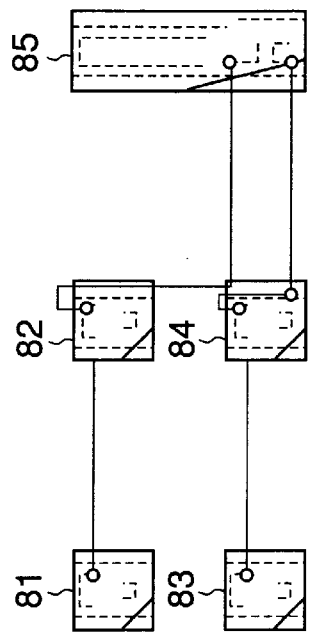
Figure 15A:
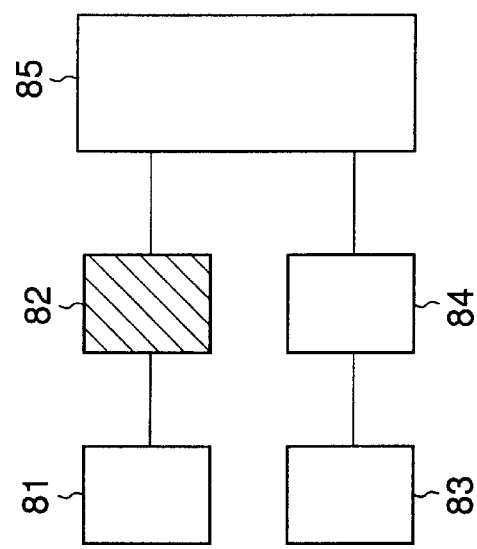

FIGS. 15A, 15B and 15C are diagrams for explaining the addition of the cell in an actual layout, and corresponds to the case described above in conjunction with FIGS. 6A, 6B, 7A and 7B. In FIGS. 15A through 15C and FIGS. 16A through 18C which will be described later, a circular mark within the cell indicates a terminal or a pin.

FIG. 15A shows a logic design prior to the timing adjustment process, including cells 81, 83, 84 and 85. In this case, a cell 82 indicated by the hatching in FIG. 15A is added by the timing adjustment process. Hence, the layout after the timing adjustment process becomes as shown in FIG. 15B, where the added cell 82 is displayed in the overlapping manner as indicated by the hatching. The operator moves the added cell 82 shown in FIG. 15B and the automatic wiring process is carried out, so that the final layout shown in FIG. 15C is obtained.

Figure 16C:
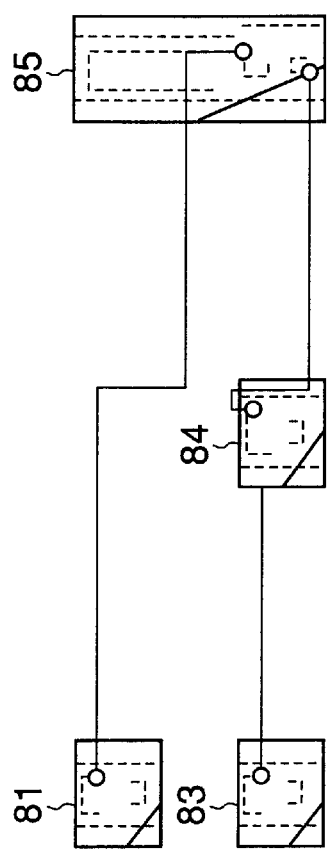
FIGS. 16A, 16B and 16C are diagrams for explaining the deletion of the cell in an actual layout.
Figure 16B:
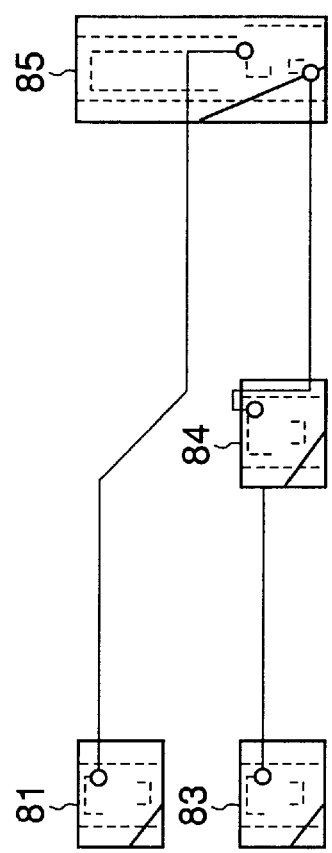
Figure 16A:
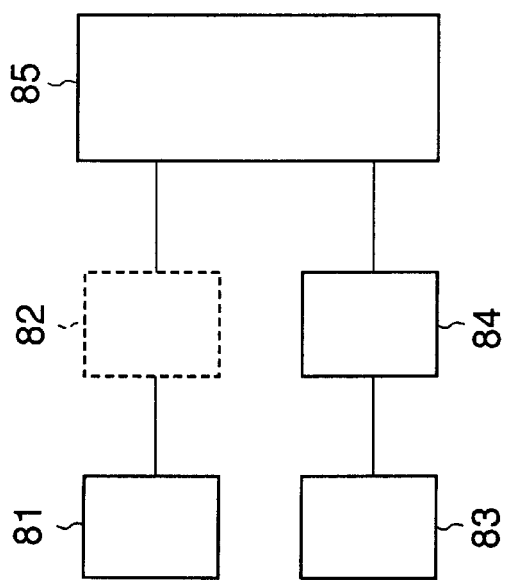

FIGS. 16A, 16B and 16C are diagrams for explaining the deletion of the cell in an actual layout, and corresponds to the case described above in conjunction with FIGS. 8A, 8B, 9A and 9B.

FIG. 16A shows a logic design prior to the timing adjustment process, including cells 81, 82, 83, 84 and 85. In this case, the cell 82 indicated by the broken line in FIG. 16A is deleted by the timing adjustment process. Hence, the layout after the timing adjustment process becomes as shown in FIG. 16B. The automatic wiring process is carried out, so that the final layout shown in FIG. 16C is obtained.

Figure 17B:
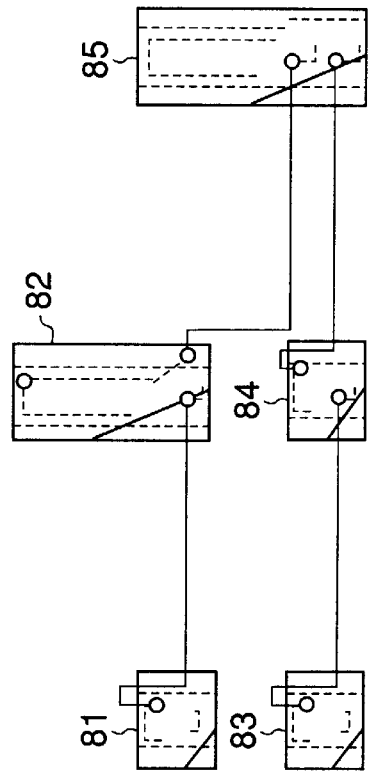
FIGS. 17A, 17B and 17C are diagrams for explaining the replacement of the cell by the cell having the large driving capacity in an actual layout.
Figure 17C:
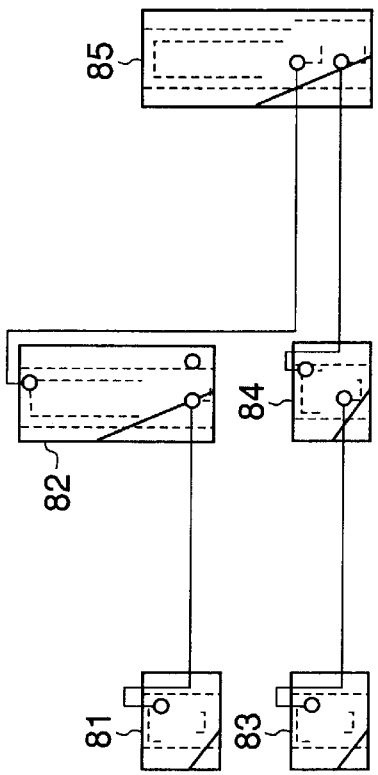
Figure 17A:
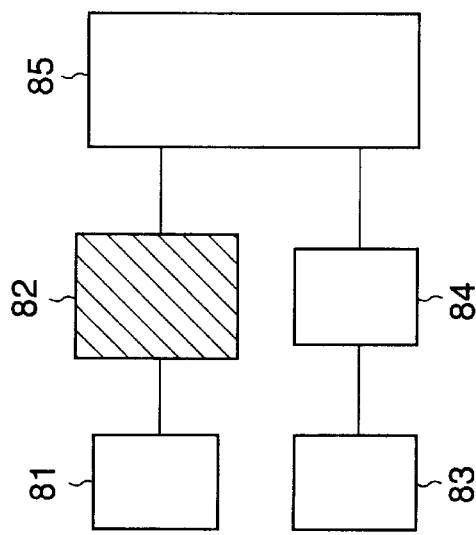

FIGS. 17A, 17B and 17C are diagrams for explaining the replacement of the cell by the cell having the large driving capacity in an actual layout, and corresponds to the case described above in conjunction with FIGS. 10A, 10B, 11A and 11B.

FIG. 17A shows a logic design prior to the timing adjustment process, including cells 81, 82, 83, 84 and 85. In this case, the original cell 82 is replaced by a cell 82 which is indicated by the hatching in FIG. 17A and has a larger driving capacity than that of the original cell 82 by the timing adjustment process. Hence, the layout after the timing adjustment process becomes as shown in FIG. 17B. The automatic wiring process is carried out, so that the final layout shown in FIG. 17C is obtained.

FIGS. 18A, 18B and 18C are diagrams for explaining the replacement of the cell by the cell having the small driving capacity in an actual layout, and corresponds to the case described above in conjunction with FIGS. 12A, 12B, 13A and 13B.

FIG. 18A shows a logic design prior to the timing adjustment process, including cells 81, 82, 83, 84 and 85. In this case, the original cell 82 is replaced by a cell 82 which is indicated by the hatching in FIG. 18A and has a smaller driving capacity than that of the original cell 82 by the timing adjustment process. Hence, the layout after the timing adjustment process becomes as shown in FIG. 18B. The automatic wiring process is carried out, so that the final layout shown in FIG. 18C is obtained.

Further, the present invention is not limited to these embodiments, but various variations and modifications may be made without departing from the scope of the present invention.

What is claimed is:

1. A LSI layout designing apparatus implemented by a computer and designing a layout of a LSI on a display screen, comprising:

timing adjusting means for carrying out a timing adjustment process with respect to logic circuit data of the LSI already subjected to a layout process; and layout restoration means for restoring an original layout of the LSI prior to the timing adjustment process and reflecting a change of cells caused by the timing adjustment process on the original layout which is displayed on the display screen.

2. The LSI layout designing apparatus as claimed in claim 1, wherein said layout restoration means includes means for forming a new wiring by an automatic wiring process in addition to an original wiring of the original layout existing after the timing adjustment process depending on the change of the cells.

3. The LSI layout designing apparatus as claimed in claim 1, wherein said layout restoration means includes means for displaying on the display screen a specific cell which is added or replaced by the timing adjustment process in an overlapping manner on other cells of the original layout existing after the timing adjustment process with a display format which is distinguishable from the other cells.

4. The LSI designing apparatus as claimed in claim 1, which further comprises:

input means for inputting information, said layout restoration means including means for moving a location of the specific cell in the original layout which is displayed on the display screen in response to the information input from said input means.

5. The LSI layout designing apparatus as claimed in claim 1, wherein said layout restoration means includes means for deleting a specific cell which is deleted by the timing adjustment process from the original layout displayed on the display screen.

6. A computer-implemented method of designing a LSI layout on a display screen, comprising the steps of:

(a) carrying out a timing adjustment process with respect to logic circuit data of the LSI already subjected to a layout process; and (b) restoring an original layout of the LSI prior to the timing adjustment process and reflecting a change of cells caused by the timing adjustment process on the original layout which is displayed on the display screen.

7. The computer-implemented method as claimed in claim 6, wherein said step (b) includes forming a new wiring by an automatic wiring process in addition to an original wiring of the original layout existing after the timing adjustment process depending on the change of the cells.

8. The computer-implemented method as claimed in claim 6, wherein said step (b) includes displaying on the display screen a specific cell which is added or replaced by the timing adjustment process in an overlapping manner on other cells of the original layout existing after the timing adjustment process with a display format which is distinguishable from the other cells.

9. The computer-implemented method as claimed in claim 6, wherein said step (b) includes moving a location of the specific cell in the original layout which is displayed on the display screen in response to an operation.

10. The computer-implemented method as claimed in claim 6, wherein said step (b) includes deleting a specific cell which is deleted by the timing adjustment process from the original layout displayed on the display screen.

11. A computer readable storage medium which stores a program for causing a computer to design a LSI layout on a display screen, comprising:

timing adjusting-means for causing the computer to carry out a timing adjustment process with respect to logic circuit data of the LSI already subjected to a layout process; and layout restoration means for causing the computer to restore an original layout of the LSI prior to the timing adjustment process and reflect a change of cells caused by the timing adjustment process on the original layout which is displayed on the display screen.

12. The computer readable storage medium as claimed in claim 11, wherein said layout restoration means includes means for causing the computer to form a new wiring by an automatic wiring process in addition to an original wiring of the original layout existing after the timing adjustment process depending on the change of the cells.

13. The computer readable storage medium as claimed in claim 11, wherein said layout restoration means includes means for causing the computer to display on the display screen a specific cell which is added or replaced by the timing adjustment process in an overlapping manner on other cells of the original layout existing after the timing adjustment process with a display format which is distinguishable from the other cells.

14. The computer readable storage medium as claimed in claim 11, wherein said layout restoration means includes means for causing the computer to move a location of the specific cell in the original layout which is displayed on the display screen in response to information input to said computer.

15. The computer readable storage medium as claimed in claim 11, wherein said layout restoration means includes means for causing the computer to delete a specific cell which is deleted by the timing adjustment process from the original layout displayed on the display screen.

* * * * *